US010748308B2

(12) United States Patent
Uetake et al.

(10) Patent No.: US 10,748,308 B2
(45) Date of Patent: Aug. 18, 2020

(54) THREE-DIMENSIONAL IMAGE RECONSTRUCTION METHOD

(71) Applicant: JEOL Ltd., Tokyo (JP)

(72) Inventors: Yusuke Uetake, Tokyo (JP); Shunsuke Asahina, Tokyo (JP); Yuuki Yamaguchi, Tokyo (JP)

(73) Assignee: JEOL Ltd., Tokyo (JP)

( * ) Notice: Subject to any disclaimer, the term of this patent is extended or adjusted under 35 U.S.C. 154(b) by 195 days.

(21) Appl. No.: 16/104,308

(22) Filed: Aug. 17, 2018

(65) Prior Publication Data
US 2019/0057522 A1   Feb. 21, 2019

(30) Foreign Application Priority Data
Aug. 17, 2017   (JP) .................. 2017-157298

(51) Int. Cl.
*G06T 11/00*    (2006.01)
*G06T 7/11*     (2017.01)
*G06T 7/33*     (2017.01)
*H01J 37/28*    (2006.01)
*G01N 1/28*     (2006.01)

(52) U.S. Cl.
CPC .............. *G06T 11/003* (2013.01); *G06T 7/11* (2017.01); *G06T 7/337* (2017.01); *H01J 37/28* (2013.01); *G01N 1/286* (2013.01); *G06T 2207/10061* (2013.01); *H01J 2237/226* (2013.01); *H01J 2237/31745* (2013.01)

(58) Field of Classification Search
None
See application file for complete search history.

(56) References Cited

U.S. PATENT DOCUMENTS

| 5,774,224 | A  | * | 6/1998  | Kerstens ................. G01B 9/04 356/394 |
| 5,907,157 | A  |   | 5/1999  | Yoshioka et al. |
| 6,373,070 | B1 | * | 4/2002  | Rasmussen ........... H01J 37/228 250/492.1 |
| 6,646,733 | B1 | * | 11/2003 | Marttila ............. G01N 21/8422 356/237.1 |
| 7,289,224 | B2 | * | 10/2007 | De Lega ............ G01B 11/0675 356/497 |
| 7,561,279 | B2 | * | 7/2009  | Castonguay .............. G01J 9/02 356/495 |

(Continued)

FOREIGN PATENT DOCUMENTS

| JP | 8115699 A | 5/1996 |
| JP | 9210883 A | 8/1997 |

*Primary Examiner* — Iman K Kholdebarin
(74) *Attorney, Agent, or Firm* — The Webb Law Firm

(57) ABSTRACT

A three-dimensional image reconstruction method, in which a cross section preparation step includes: a specimen preparation step of attaching, on a surface of a specimen, a grid-like mark member in which rectangular openings are two-dimensionally arranged, and disposing the grid-like mark member under a shielding member so that a side of each of the rectangular openings of the grid-like mark member forms a 45-degree or 90-degree angle with respect to a direction in which a linear end edge of the shielding member extends; and a processing position determination step of adjusting relative positions of the shielding member and the grid-like mark member by using the grid-like mark member as an index of a processing position.

7 Claims, 5 Drawing Sheets

(56) References Cited

U.S. PATENT DOCUMENTS

| | | | | |
|---|---|---|---|---|
| 7,630,069 | B2* | 12/2009 | Naftali | G01N 21/95607 356/237.2 |
| 7,869,057 | B2* | 1/2011 | De Groot | G01B 9/02044 356/511 |
| 7,924,435 | B2* | 4/2011 | Colonna De Lega | G01B 9/02057 356/511 |
| 7,978,338 | B2* | 7/2011 | De Groot | G01B 11/2441 356/497 |
| 8,059,336 | B2* | 11/2011 | Ptitsyn | G01B 9/04 359/363 |
| 8,254,020 | B2* | 8/2012 | Holy | G02B 21/08 359/385 |
| 8,269,980 | B1* | 9/2012 | Szwaykowski | G01B 11/2441 356/504 |
| 10,481,375 | B2* | 11/2019 | Cooper | G02B 21/086 |
| 2012/0133928 | A1* | 5/2012 | Urano | G01N 21/9501 356/237.2 |
| 2013/0251992 | A1* | 9/2013 | Kono | D01F 6/60 428/364 |
| 2016/0148779 | A1* | 5/2016 | Sakuda | G01N 1/32 250/492.3 |
| 2019/0017904 | A1* | 1/2019 | Giannuzzi | G01N 1/08 |

* cited by examiner

THREE-DIMENSIONAL IMAGE RECONSTRUCTION METHOD

CROSS-REFERENCE TO RELATED APPLICATION

This application claims priority to Japanese Patent Application No. 2017-157298 filed Aug. 17, 2017, the disclosure of which is hereby incorporated in its entirety by reference.

BACKGROUND OF THE INVENTION

Field of the Invention

The present invention relates to a method of reconstructing a three-dimensional image of a specimen, the method including preparing a cross section of the specimen by using an ion beam and observing the cross section by a scanning electron microscope (hereinafter, referred to as an SEM).

Description of Related Art

A three-dimensional image of a specimen is reconstructed in order to analyze an internal structure of the specimen. So far, a plurality of methods of reconstructing a three-dimensional image of a specimen have been proposed. As a representative method, a method of reconstructing a three-dimensional image of a specimen is known in which a step of preparing a cross section of the specimen by cutting and a step of acquiring an SEM image of the cross section of the specimen are alternately repeated and a plurality of acquired SEM images are arranged in the order in which the SEM images have been acquired.

Methods of preparing a cross section of a specimen by cutting have also been proposed in plurality. Examples thereof include microtomy in which a specimen is cut by a glass knife, a diamond knife, or the like and a focused ion beam (hereinafter, referred to as an FIB) method in which a specimen is irradiated by a tightly focused ion beam to cut the specimen. JP-A-H08-115699 describes a method of reconstructing a three-dimensional image of a specimen using the FIB method.

However, microtomy and the FIB method described above have a problem in that specimens suitable for preparing a cross section are limited. Since a glass knife or a diamond knife is used in microtomy to cut specimens, microtomy is not suitable for hard specimens. Due to a small beam diameter (10 nm to 200 nm) of the ion beam, the FIB method is not suitable for large specimens of several 100 µm square or larger.

In consideration of such problems, JP-A-H09-210883 proposes a sectional specimen preparation device which is provided with a shielding plate disposed so as to cover a part of a specimen and which cuts the specimen exposed from the shielding plate by irradiating the specimen with an ion beam having a large beam diameter. Since the device described in JP-A-H09-210883 uses an ion beam to cut a specimen, the device is suitable not only for soft specimens but also for hard specimens. In addition, since the device described in JP-A-H09-210883 uses an ion beam with a large beam diameter (0.5 to 2 mm), the device is suitable for large specimens of several 100 µm square or larger.

With the sectional specimen preparation device described in JP-A-H09-210883, a portion exposed from the shielding plate in a specimen is cut by the ion beam. Therefore, a position of an end of the shielding plate serves as a cutting position. Consequently, in order to obtain an accurate three-dimensional image, an observer needs to cut the specimen by shifting the position of the end of the shielding plate relative to the specimen at constant narrow intervals. However, since the observer could only rely on the intuition of the observer to determine an amount by which the position of the end of the shielding plate is to be shifted relative to the specimen, it was difficult to prepare a cross section of the specimen by cutting the specimen at constant narrow intervals.

SUMMARY OF THE INVENTION

The invention may provide a method of reconstructing a three-dimensional image of a specimen which, with respect to a large specimen of 100 µm square or larger, prepares a cross section of the specimen at constant narrow intervals and obtains an accurate three-dimensional image.

According to a first aspect of the invention, there is provided a three-dimensional image reconstruction method of reconstructing a three-dimensional image of a specimen, the method comprising:

alternately repeating a cross section preparation step and a sectional image acquisition step, the cross section preparation step preparing a cross section of the specimen by using a sectional specimen preparation device which is provided with a shielding member disposed so as to cover a part of the specimen, and which prepares a cross section at a processing position on the specimen with an ion beam, the processing position being a boundary between a portion of the specimen exposed from a linear end edge of the shielding member and a portion of the specimen covered by the shielding member; and the sectional image acquisition step acquiring a sectional image of the specimen with imaging means, and arranging a plurality of the acquired sectional images with an image processing device in the order in which the acquired sectional images have been captured, the cross section preparation step including:

a specimen preparation step of attaching, on a surface of the specimen, a grid-like mark member in which rectangular openings are two-dimensionally arranged, and disposing the grid-like mark member under the shielding member so that a side of each of the rectangular openings of the grid-like mark member forms a 45-degree angle with respect to a direction in which the linear end edge of the shielding member extends; and a processing position determination step of adjusting relative positions of the shielding member and the grid-like mark member by using the grid-like mark member as an index of the processing position.

According to a second aspect of the invention, there is provided a three-dimensional image reconstruction method of reconstructing a three-dimensional image of a specimen, the method comprising:

alternately repeating a cross section preparation step and a sectional image acquisition step, the cross section preparation step preparing a cross section of the specimen by using a sectional specimen preparation device which is provided with a shielding member disposed so as to cover a part of the specimen, and which prepares a cross section at a processing position with an ion beam, the processing position being a boundary between a portion of the specimen exposed from a linear end edge of the shielding member and a portion of the specimen covered by the shielding member; and the sectional image acquisition step acquiring a sectional image of the specimen with imaging means, and arranging a plurality of the acquired sectional images with an image processing device in the order in which the acquired sectional images have been captured, the cross section preparation step including:

a specimen preparation step of attaching, on a surface of the specimen, a grid-like mark member in which rectangular openings are two-dimensionally arranged, and disposing the grid-like mark member under the shielding member so that a side of each of the rectangular openings of the grid-like mark member forms a 90-degree angle with respect to a direction in which the linear end edge of the shielding member extends; and a processing position determination step of adjusting relative positions of the shielding member and the grid-like mark member by using the grid-like mark member as an index of the processing position.

DESCRIPTION OF THE INVENTION

Figure 1:
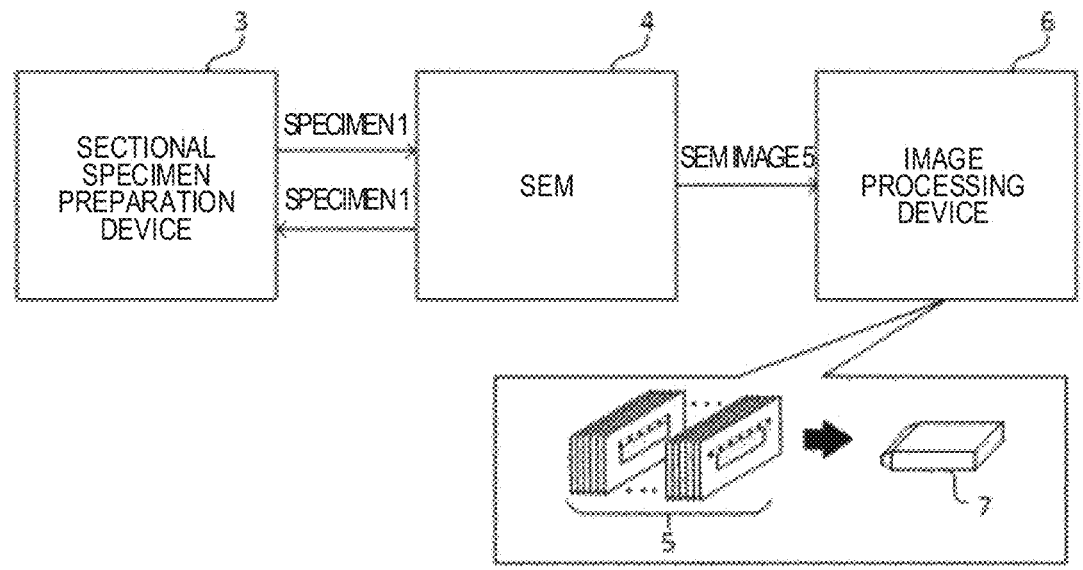
FIG. 1 is a diagram illustrating an overview of the invention.

According to one embodiment of the invention, there is provided a three-dimensional image reconstruction method of reconstructing a three-dimensional image of a specimen, the method comprising:

alternately repeating a cross section preparation step and a sectional image acquisition step, the cross section preparation step preparing a cross section of the specimen by using a sectional specimen preparation device which is provided with a shielding member disposed so as to cover a part of the specimen, and which prepares a cross section at a processing position on the specimen with an ion beam, the processing position being a boundary between a portion of the specimen exposed from a linear end edge of the shielding member and a portion of the specimen covered by the shielding member; and the sectional image acquisition step acquiring a sectional image of the specimen with imaging means, and arranging a plurality of the acquired sectional images with an image processing device in the order in which the acquired sectional images have been captured, the cross section preparation step including:

a specimen preparation step of attaching, on a surface of the specimen, a grid-like mark member in which rectangular openings are two-dimensionally arranged, and disposing the grid-like mark member under the shielding member so that a side of each of the rectangular openings of the grid-like mark member forms a 45-degree or 90-degree angle with respect to a direction in which the linear end edge of the shielding member extends; and a processing position determination step of adjusting relative positions of the shielding member and the grid-like mark member by using the grid-like mark member as an index of the processing position.

Hereinafter, embodiments of the invention will be described with reference to FIGS. 1 to 6. In this description and in the respective drawings, components having substantially the same configuration or function will be added a shared reference numeral and redundant descriptions will be omitted.

1. Overview

Hereinafter, an overview of the invention will be described. FIG. 1 is a diagram illustrating an overview of the invention. First, a cross section 2 of a specimen 1 is prepared by a sectional specimen preparation device 3 (a cross section preparation step). Next, an image of the cross section 2 of the specimen 1 is captured by an SEM 4 and an SEM image 5 of the cross section 2 is obtained (a sectional image acquisition step). After the SEM image 5 is obtained, the specimen 1 is returned to the sectional specimen preparation device 3 and the cross section preparation step is performed once again. In addition, the specimen 1 of which a new cross section 2 has been prepared is once again loaded to the SEM 4 and the SEM image 5 of the new cross section 2 is captured.

Subsequently, in exactly the same manner, the cross section preparation step and the sectional image acquisition step are alternately repeated, and once a predetermined number of (generally, around 30 to 100) SEM images 5 are acquired, the SEM images 5 are imported to an image processing device 6. Finally, the image processing device 6 arranges the SEM images 5 in the order in which the SEM images 5 have been captured and reconstructs three-dimensional image data of the specimen 1, and a three-dimensional image 7 is displayed on a three-dimensional image display device (not illustrated) based on the three-dimensional image data (a three-dimensional image reconstruction step).

2. Configuration of Sectional Specimen Preparation Device

Figures 2A, 2B:
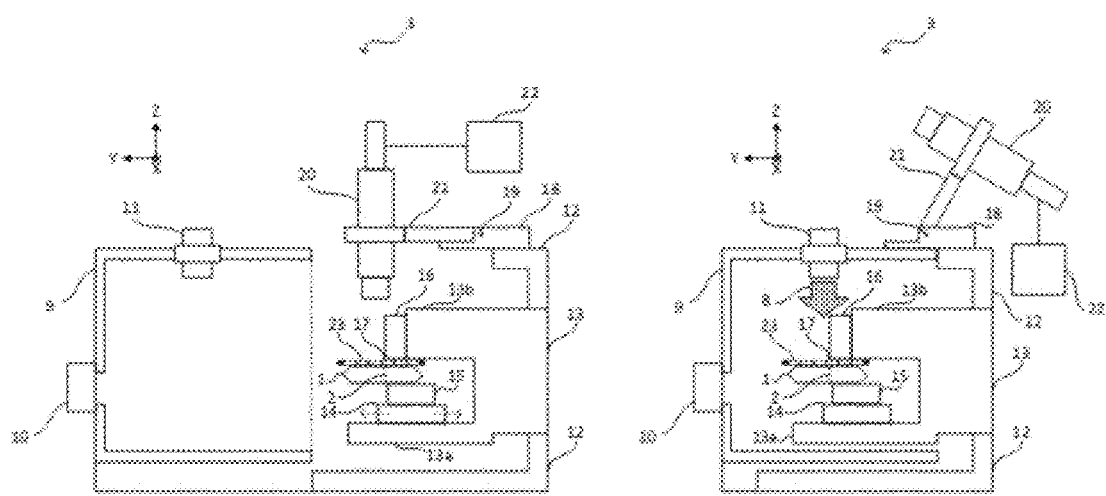
FIGS. 2A and 2B are schematic configuration diagrams of a sectional specimen preparation device.

A configuration of the sectional specimen preparation device 3 which irradiates the specimen 1 with an ion beam 8 having a large beam diameter and which prepares the cross section 2 of the specimen 1 will be described with reference to FIGS. 2A and 2B. FIGS. 2A and 2B are schematic configuration diagrams of the sectional specimen preparation device 3, in which FIG. 2A is a diagram illustrating a state where an inside of the sectional specimen preparation device 3 is set under atmospheric pressure, a position of the specimen 1 is adjusted, and a position where the cross section 2 is prepared is determined, and FIG. 2B is a diagram illustrating a state after the step of FIG. 2A where the inside of the sectional specimen preparation device 3 is evacuated and the cross section 2 is prepared by the ion beam 8.

As illustrated in FIG. 2B, a vacuum chamber 9 constitutes a space in which the specimen 1 is housed when being cut, and an evacuation mechanism 10 is provided on a side surface of the vacuum chamber 9. An ion gun 11 is mounted to an upper part of the vacuum chamber 9 and generates ions by discharging a gas such as argon. The generated ions are accelerated by an electric field inside the ion gun 11 and the ion beam 8 is emitted from the ion gun 11.

A specimen holder extracting mechanism 12 is mounted to the vacuum chamber 9 so as to place the vacuum chamber 9 in an open state as illustrated in FIG. 2A or a closed state as illustrated in FIG. 2B, and is capable of moving in a left-right direction (a Y-axis direction) in the diagrams. A specimen holder 13 is mounted to the specimen holder extracting mechanism 12. The specimen holder 13 moves into and out from the vacuum chamber 9 as the specimen holder extracting mechanism 12 moves. The specimen holder 13 can be mounted to and dismounted from the specimen holder extracting mechanism 12.

A specimen mount position adjustment mechanism 14 is mounted to an upper surface of a lower stage part 13a of the specimen holder 13 and is movable in the Y-axis direction. A specimen mount 15 is set on the specimen mount position adjustment mechanism 14 and moves in the Y-axis direction with a movement of the specimen mount position adjustment mechanism 14. The specimen mount 15 is formed in a rectangular parallelepiped and the specimen 1 is mounted to an upper surface of the specimen mount 15 by an adhesive such as an epoxy resin.

A shielding plate 16 is disposed on an upper side of the specimen 1 and, at the same time, mounted to an upper stage part 13b of the specimen holder 13. The shielding plate 16 can be mounted to and dismounted from the specimen holder 13. In addition, the shielding plate 16 covers a part of the specimen 1 and prevents the covered portion of the specimen 1 from being irradiated by the ion beam 8. Therefore, in the specimen 1, a portion positioned at an end of the shielding plate 16 serving as a cutting position 17, the portion exposed from the shielding plate 16 is cut, and the cross section 2 is prepared at the cutting position 17.

As described above, since the shielding plate 16 is mounted to the specimen holder 13, the shielding plate 16 cannot move on its own. Therefore, when determining the cutting position 17, an observer moves the specimen 1 in the Y-axis direction by moving the specimen mount position adjustment mechanism 14 in the Y-axis direction, and moves a portion where the observer desires to prepare the cross section 2 in the specimen 1 to an end position of the shielding plate 16.

An optical microscope tilting mechanism 18 is mounted to an upper end part of the specimen holder extracting mechanism 12 and has a shaft 19 parallel to an X axis. An optical microscope position adjustment mechanism 21 which holds an optical microscope 20 is connected to the optical microscope tilting mechanism 18 via the shaft 19 and is capable of tilting by rotating around the shaft 19. As illustrated in FIG. 2B, the optical microscope position adjustment mechanism 21 is tilted so that the optical microscope 20 does not interfere with the vacuum chamber 9 when the vacuum chamber 9 is placed in a closed state.

An optical microscope image display unit 22 is connected to the optical microscope 20. Upper surface images of the specimen 1 and the shielding plate 16 having been enlarged by the optical microscope 20 are displayed on the optical microscope image display unit 22. When determining the cutting position 17, the observer moves the specimen mount position adjustment mechanism 14 while viewing the optical microscope image display unit 22.

3. Configuration of Grid-Like Member

Figure 3:
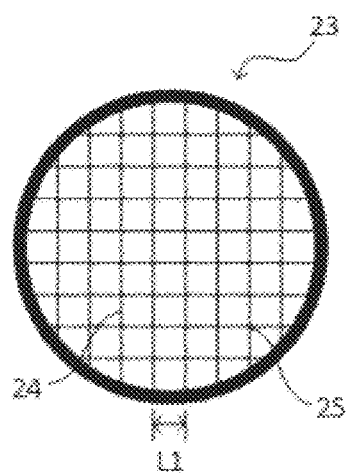
FIG. 3 is a diagram illustrating a grid mesh according to the first and second embodiments of the invention.

A configuration of a grid-like member (a grid-like mark member) 23 illustrated in FIGS. 2A and 2B will be described with reference to FIG. 3. In the embodiments of the invention described below, a grid mesh 23 used to support a specimen of a transmission electron microscope is used as an example of the grid-like member 23. FIG. 3 is a diagram illustrating the grid mesh 23 according to the first and second embodiments of the invention. It should be noted that, in the respective drawings, the grid mesh 23 is illustrated with a reduced number of grids for the sake of clarity.

The grid mesh 23 is a circular metal mesh with a diameter of around 3 mm and is provided with a plurality of orthogonal bars 24 constituting grids at a center portion as illustrated in FIG. 3, and a minimum repetitive unit constituting the grids (hereinafter, referred to as a unit grid) has a square shape. Reference numeral 25 indicates a lattice point that is an intersection of the bars 24. The grid mesh 23 comes in a plurality of types depending on a material thereof and shapes and sizes of the unit grid. In the embodiments of the invention, the material of the grid mesh 23 is not limited and a shape of the unit grid is desirably a regular polygon such as a square or a regular hexagon. When a grid mesh 23 with a square unit grid is used as illustrated in FIG. 3, a distance L1 (an arrangement pitch) of adjacent bars 24 is desirably equal to or less than 100 μm.

Using the sectional specimen preparation device 3 and the grid mesh 23 configured as described above, the observer prepares the cross section 2 of the specimen 1 as follows.

4. First Embodiment

Figure 4:
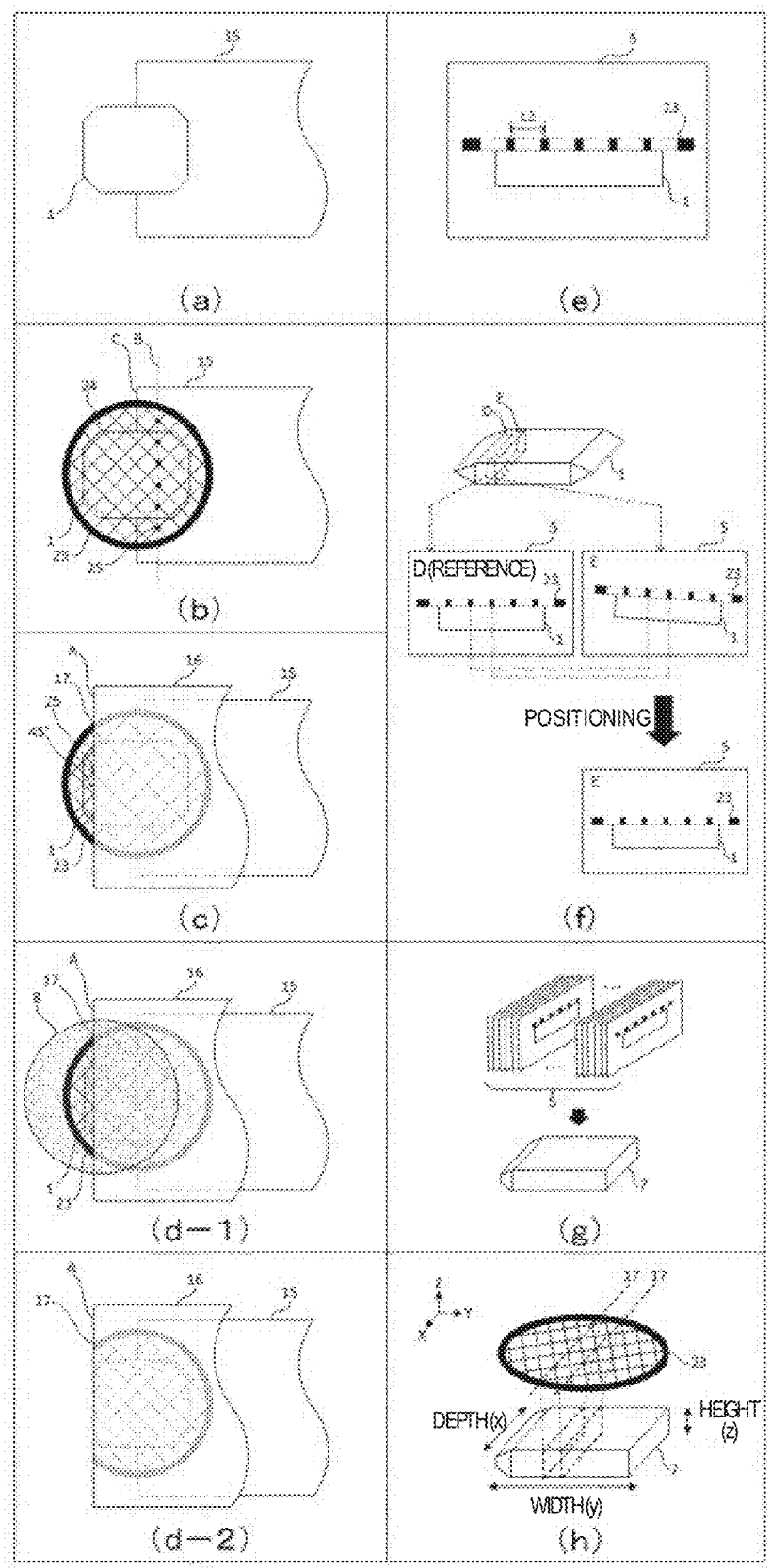
FIG. 4 is a diagram illustrating a flow of a method of reconstructing a three-dimensional image of a specimen according to the first embodiment of the invention.

Hereinafter, the first embodiment of the invention will be described with reference to FIG. 4. FIG. 4 is a diagram illustrating a flow of a method of reconstructing a three-dimensional image of the specimen 1 according to the first embodiment of the invention. In FIG. 4, (a) to (d-2) are diagrams illustrating subdivisions of the cross section preparation step and (e) to (h) are diagrams illustrating subdivisions of the sectional image acquisition step and the three-dimensional image reconstruction step.

(1) Preparation step of the specimen 1: First, the observer prepares a plate-like specimen 1 processed so as to have a smooth surface. When a shape of the specimen 1 is irregular and small, the observer embeds the specimen 1 in resin and then processes the embedded specimen 1 to create a smooth surface. In the embodiments of the invention, the specimen 1 with the grid mesh 23 mounted to a surface thereof is subsequently irradiated with the ion beam 8. Therefore, by smoothing the surface of the specimen 1 in advance, a gap is prevented from being created between the specimen 1 and the grid mesh 23 and a situation can be avoided where, when the specimen 1 is irradiated with the ion beam 8, the gap causes a traveling direction of the ion beam 8 to change and the ion beam 8 irradiates a position of the specimen 1 deviated from a target cutting position 17.

(2) Mounting step of the specimen 1 ((a) in FIG. 4): Next, as illustrated in (a) in FIG. 4, the observer mounts the specimen 1 to the specimen mount 15 using an adhesive such as an epoxy resin. In doing so, the observer mounts the specimen 1 so that a portion where the cross section 2 is to be prepared in the specimen 1 protrudes from the specimen mount 15.

(3) Mounting step of the grid mesh 23 ((b) in FIG. 4): Next, as illustrated in (b) in FIG. 4, the observer mounts the grid mesh 23 to the smooth surface of the specimen 1 using an adhesive such as an epoxy resin. In doing so, the observer mounts the grid mesh 23 to the specimen 1 so that, among sides of the shielding plate 16 to be subsequently placed on top of the grid mesh 23, a side A that forms the cutting position 17 on the specimen 1 and the bar 24 form an angle of 45 degrees (refer to (c) in FIG. 4). In this case, as illustrated in (b) in FIG. 4, the observer mounts the grid mesh 23 to the specimen 1 so that a straight line B connecting lattice points 25 at diagonal positions is parallel to a side C of the specimen mount 15.

(4) Mounting step of the shielding plate 16: Next, after setting the specimen mount 15 on the specimen mount position adjustment mechanism 14, the observer mounts the shielding plate 16 to the specimen holder 13 so that the shielding plate 16 is positioned above the grid mesh 23.

(5) Determination step of the cutting position 17 ((c) in FIG. 4): Next, after mounting the specimen holder 13 to the specimen holder extracting mechanism 12, the observer determines the cutting position 17 by moving the specimen 1 mounted with the grid mesh 23 with respect to the shielding plate 16 using the specimen mount position adjustment mechanism 14. In doing so, while viewing the enlarged upper-surface images of the specimen 1, the grid mesh 23, and the shielding plate 16 displayed on the optical microscope image display unit 22 (the state illustrated in FIG. 2A), the observer moves the specimen mount position adjustment mechanism 14 to move a position of the lattice point 25 to the end position of the shielding plate 16 as illustrated in (c) in FIG. 4.

Alternatively, in this step, when the sectional specimen preparation device 3 is provided with a shielding plate position adjustment mechanism capable of moving the position of the shielding plate 16, the observer may move the end position of the shielding plate 16 to the position of the lattice point 25 by adjusting the shielding plate position adjustment mechanism.

(6) Irradiation step of the ion beam 8 ((d-1) and (d-2) in FIG. 4): Next, the observer pushes the specimen holder extracting mechanism 12 into the vacuum chamber 9 (the state illustrated in FIG. 2B), and after evacuating the inside of the vacuum chamber 9 with the evacuation mechanism 10, irradiates the specimen 1 with the ion beam 8 to prepare the cross section 2. In FIG. 4, (d-1) is an enlarged top view of a vicinity of the specimen 1 when the specimen 1 is being irradiated with the ion beam 8 according to the first embodiment, and (d-2) is an enlarged top view of the vicinity of the specimen 1 after the specimen 1 has been irradiated with the ion beam 8 according to the first embodiment. As illustrated in (d-1) in FIG. 4, when the specimen 1 is irradiated with the ion beam 8, portions exposed from the shielding plate 16 in the specimen 1 and the grid mesh 23 are gradually cut and, eventually, portions hidden behind the shielding plate 16 remain as illustrated in (d-2) in FIG. 4.

(7) Acquisition step of the SEM image 5 ((e) in FIG. 4): Next, the observer extracts the specimen holder extracting mechanism 12 from the vacuum chamber 9 and removes the specimen holder 13 from the specimen holder extracting mechanism 12. Subsequently, the observer dismounts the shielding plate 16 from the specimen holder 13 and dismounts the specimen mount 15 mounted with the specimen 1 from the specimen mount position adjustment mechanism 14. In addition, the observer sets the specimen 1 mounted with the grid mesh 23 to the SEM 4. Subsequently, the cross section 2 of the specimen 1 is observed by the SEM 4 and an SEM image 5 of the cross section 2 is obtained.

In FIG. 4, (e) represents an example of the SEM image 5 of the cross section 2. As illustrated in (e) in FIG. 4, a sectional image of the specimen 1 and discontinuous sectional images of the grid mesh 23 appear on the SEM image 5. In the first embodiment, the unit grid has a square shape and the grid mesh 23 is mounted to the specimen 1 so that an angle formed between the side A of the shielding plate 16 that forms the cutting position 17 and the bar 24 is 45 degrees. Furthermore, the position of the lattice point 25 is the cutting position 17. Therefore, the sectional image of the grid mesh 23 that appears on the SEM image 5 is a sectional image of the lattice point 25 and intervals L2 of the discontinuous sectional images of the grid mesh 23 are regular intervals.

After a first SEM image 5 is acquired by the steps described above, the observer returns to (4) Mounting step of the shielding plate 16, once again prepares the cross section 2 using a lattice point 25 at a diagonal position of the lattice point 25 of the cutting position 17 which has already been cut as a next cutting position 17, and acquires a second SEM image 5 by observing the prepared cross section 2 with the SEM 4. In addition, the observer alternately repeats the cross section preparation step and the sectional image acquisition step until a predetermined number of (around 30 to 100) SEM images 5 are obtained.

It should be noted that, even when the predetermined number of SEM images 5 are obtained, when it is determined in (7) Acquisition step of the SEM image 5 that a sectional image of the specimen portion of which a three-dimensional image 7 is to be reconstructed has not yet been obtained, the observer increases the number of SEM images 5 to be acquired and alternately repeats the cross section preparation step and the sectional image acquisition step until the increased number of SEM images 5 are obtained.

(8) Extraction and importing step of the SEM images 5: Once the predetermined number of SEM images 5 are obtained, all of the obtained SEM images 5 are imported into the image processing device 6 from the SEM 4.

(9) Positioning step of the SEM images 5 ((f) in FIG. 4): Next, the observer positions each obtained SEM image 5 in the image processing device 6. In FIG. 4, (f) is a diagram which illustrates respective SEM images 5 of arbitrary cutting positions D and E and which also illustrates how the SEM image 5 at the cutting position E is positioned using the SEM image 5 at the cutting position D as a reference. As illustrated in (f) in FIG. 4, a position of a sectional image of the specimen 1 on an SEM image 5 differs depending on the SEM image 5 at each cutting position 17. Therefore, the observer needs to position the sectional image of the specimen 1 on each SEM image 5 before arranging the SEM images 5.

In the first embodiment, since the specimen 1 is cut for each lattice point 25 at a diagonal position of the unit grid, a relative position of the sectional image of the grid mesh 23 with respect to the sectional image of the specimen 1 remains unchanged in all of the SEM images 5. Therefore, as illustrated in (f) in FIG. 4, by using one SEM image 5 as a reference and respectively adjusting positions of sectional images of the grid mesh 23 at two locations on the reference SEM image 5 and sectional images of the grid mesh 23 at two corresponding locations on other SEM images 5, the observer can align the positions of the sectional image of the specimen 1 on all of the SEM images 5 in all of a left-right direction, an up-down direction, and a direction of rotation on the SEM images 5.

It should be noted that the positioning of the SEM images 5 may be manually performed by the observer, or when the image processing device 6 has a function of automatically recognizing a sectional image of a common object on each SEM image 5 and automatically adjusting the position of the common object or a function of automatically aligning two specified positions, the observer may use such a function of the image processing device 6.

(10) Reconstruction step of three-dimensional image data ((g) in FIG. 4): Next, the image processing device 6 arranges all of the SEM images 5 in the order in which the SEM images 5 have been captured and reconstructs three-dimensional image data. Based on the three-dimensional image data, a three-dimensional image 7 of the specimen 1 is displayed on a three-dimensional image display device (not illustrated).

(11) Setting step of dimensions of the three-dimensional image 7 ((h) in FIG. 4): Finally, by inputting cutting intervals and observation conditions of the SEM 4 into the image processing device 6, the observer sets correct dimensions of the three-dimensional image 7. In FIG. 4, (h) is a diagram illustrating a positional relationship between the three-dimensional image 7 and the grid mesh 23.

As illustrated in (h) in FIG. 4, when the cross section 2 is prepared on a plane constituted by an X axis and a Z axis, a depth (a length in the X-axis direction) and a height (a length in the Z-axis direction) of the three-dimensional image 7 are obtained from a per-pixel length of the SEM image 5. For example, when a cross section with an actual size of 120×100 μm is enlarged 10 times and an SEM image 5 of 1200×1000 pixels is obtained, the per-pixel length of the SEM image 5 is 0.1 μm. Since the image processing device 6 is capable of recognizing the number of pixels of an imported SEM image 5, by having the observer input the per-pixel length of the SEM image 5 to the image processing device 6, the image processing device 6 can calculate actual dimensions of each cross section. Therefore, by inputting a per-pixel length to the image processing device 6, the observer obtains a three-dimensional image 7 of which a correct depth and height are set.

In addition, a width (a length in the Y-axis direction) of the three-dimensional image 7 can be obtained from the intervals at which the specimen 1 is cut. In the first embodiment, since the specimen 1 is cut for each lattice point 25 at a diagonal position of the unit grid, the cutting intervals are equal to a length of a diagonal of the unit grid. Therefore, by inputting the length of the diagonal of the unit grid to the image processing device 6, the observer obtains a three-dimensional image 7 of which a correct width is set.

Figure 5A:
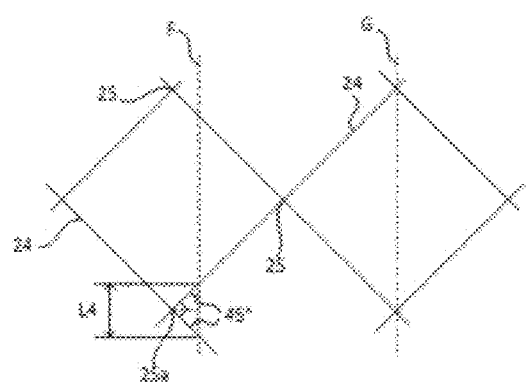
FIGS. 5A and 5B are diagrams illustrating an enlarged top view of a grid mesh and an SEM image when a cutting position deviates from a lattice point position, according to the first embodiment of the invention.
Figure 5B:
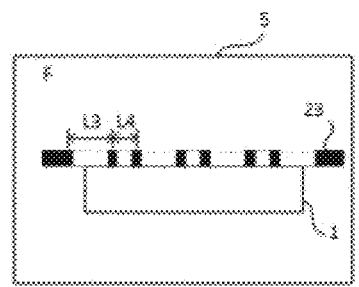

It should be noted that there may be cases where the cutting position 17 slightly deviates from a position of the lattice point 25 and the cutting intervals are no longer constant. FIGS. 5A and 5B are diagrams illustrating an enlarged top view of the grid mesh 23 and the SEM image 5 when the cutting position 17 deviates from a position of the lattice point 25 according to the first embodiment, in which FIG. 5A is an enlarged top view of the grid mesh 23 illustrating a cutting position F having deviated from a position of the lattice point 25 and a cutting position G adjacent to the cutting position F, and FIG. 5B is a diagram illustrating the SEM image 5 of the cross section 2 prepared at the cutting position F. Since the cutting position F is deviated from the position of the lattice point 25, as illustrated in FIG. 5B, the sectional image of the grid mesh 23 of the SEM image 5 at the cutting position F is a sectional image of the bar 24, and the intervals of the sectional images of the grid mesh 23 are not regular intervals but, instead, wide intervals L3 and narrow intervals L4 alternately appear.

In the first embodiment, the unit grid has a square shape and the grid mesh 23 is mounted to the specimen 1 so that an angle formed between the side A of the shielding plate 16 that forms the cutting position 17 and the bar 24 is 45 degrees. Therefore, as illustrated in FIG. 5A, an isosceles right triangle with angles of 90 degrees, 45 degrees, and 45 degrees is formed by the cutting position F and a lattice point 25a originally intended to constitute the cutting position 17. A length of a hypotenuse of the isosceles right triangle is equal to the narrower intervals L4 among the intervals of the sectional images of the grid mesh 23 of the SEM image 5. Therefore, by measuring the intervals of the sectional images of the grid mesh 23 of the SEM image 5, the observer can calculate an amount of deviation of the cutting position F from the original cutting position 17 (in the case of FIGS. 5A and 5B, 0.5× L4). As a result, even when the cutting position 17 deviates from a position of the lattice point 25, the observer can input correct cutting intervals to the image processing device 6 and correctly set the width of the three-dimensional image 7.

According to the first embodiment described above, since the specimen 1 is cut at constant narrow intervals and a sectional image of the grid mesh 23 appearing in the SEM image 5 is used as a guide when positioning a sectional image of the specimen 1 on each SEM image 5, an accurate three-dimensional image 7 can be obtained. In addition, even if the cutting position 17 deviates from a position of the lattice point 25, accurate cutting intervals can be calculated and an accurate three-dimensional image 7 can be obtained.

Figure 6:
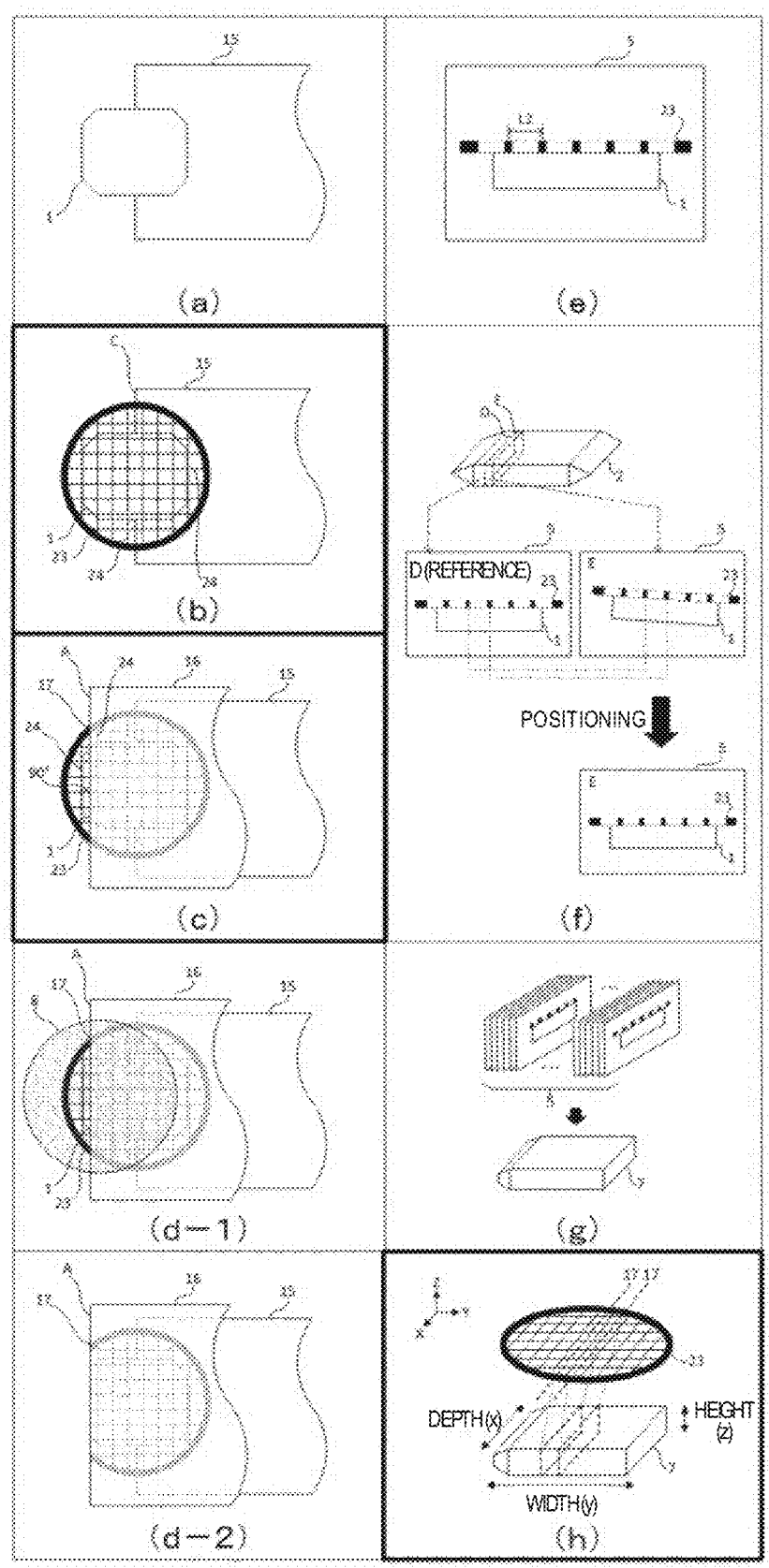
FIG. 6 is a diagram illustrating a flow of a method of reconstructing a three-dimensional image of a specimen according to the second embodiment of the invention.

5. Second Embodiment Hereinafter, the second embodiment of the invention will be described with reference to FIG. 6. FIG. 6 is a diagram illustrating a flow of a method of reconstructing a three-dimensional image of the specimen 1 according to the second embodiment of the invention. In FIGS. 6, (a) to (d-2) are diagrams illustrating subdivisions of the cross section preparation step and (e) to (h) are diagrams illustrating subdivisions of the sectional image acquisition step and the three-dimensional image reconstruction step.

It should be noted that the second embodiment differs from the first embodiment in (3) Mounting step of the grid mesh 23 ((b) in FIG. 6), (5) Determination step of the cutting position 17 ((c) in FIG. 6), and (11) Setting step of dimensions of the three-dimensional image 7 ((h) in FIG. 6). In order to clarify steps that differ from the first embodiment, in FIG. 6, diagrams representing the steps described above which differ from the first embodiment are framed in bold lines, and descriptions of steps in common with the first embodiment will be omitted hereinafter.

(3) Mounting step of the grid mesh 23 ((b) in FIG. 6): After (2) Mounting step of the specimen 1, as illustrated in (b) in FIG. 6, the observer mounts the grid mesh 23 on top of the specimen 1 using an adhesive such as an epoxy resin. In doing so, the observer mounts the grid mesh 23 to the specimen 1 so that, among sides of the shielding plate 16 to be subsequently placed on top of the grid mesh 23, the side A that forms the cutting position 17 on the specimen 1 and the bar 24 form an angle of 90 degrees (0 degrees) (refer to (c) in FIG. 6). In this case, as illustrated in (b) in FIG. 6, the observer mounts the grid mesh 23 to the specimen 1 so that the bar 24 is parallel to the side C of the specimen mount 15.

(5) Determination step of the cutting position 17 ((c) in FIG. 6): After (4) Mounting step of the shielding plate 16, the observer mounts the specimen holder 13 to the specimen holder extracting mechanism 12 and determines the cutting position 17 by moving the specimen 1 mounted with the grid mesh 23 with respect to the shielding plate 16 using the specimen mount position adjustment mechanism 14. In doing so, while viewing the enlarged upper-surface images of the specimen 1, the grid mesh 23, and the shielding plate 16 displayed on the optical microscope image display unit 22 (the state illustrated in FIG. 2A), the observer moves the specimen mount position adjustment mechanism 14 and moves a center position of adjacent bars 24 to the end position of the shielding plate 16 as illustrated in (c) in FIG. 6.

Alternatively, in this step, when the sectional specimen preparation device 3 has a shielding plate position adjustment mechanism capable of moving the position of the shielding plate 16, the observer may move the end position of the shielding plate 16 to the center position of adjacent bars 24 by adjusting the shielding plate position adjustment mechanism.

In the SEM image 5 obtained in (7) Acquisition step of the SEM image 5 according to the second embodiment, a sectional image of the specimen 1 and discontinuous sectional images of the grid mesh 23 appear in a similar manner to the first embodiment. In the second embodiment, the unit grid has a square shape and the grid mesh 23 is mounted to the specimen 1 so that an angle formed between the side A of the shielding plate 16 that forms the cutting position 17 and the bar 24 is 90 degrees (0 degrees). Furthermore, the center position of adjacent bars 24 is the cutting position 17.

Therefore, the sectional image of the grid mesh 23 that appears on the SEM image 5 in the second embodiment is a sectional image of the bar 24 and intervals L2 of the discontinuous sectional images of the grid mesh 23 are regular intervals. Furthermore, a relative position of the sectional image of the grid mesh 23 with respect to the sectional image of the specimen 1 remains unchanged in the SEM images 5 at every cutting position 17. From the above, even in the second embodiment, the observer can perform (9) Positioning step of the SEM images 5 in exactly the same manner as in the first embodiment.

(11) Setting step of dimensions of the three-dimensional image 7 ((h) in FIG. 6): After (10) Reconstruction step of three-dimensional image data, by inputting cutting intervals and observation conditions of the SEM 4 into the image processing device 6, the observer sets correct dimensions of the three-dimensional image 7. In FIG. 6, (h) is a diagram illustrating a positional relationship between the three-dimensional image 7 and the grid mesh 23. As illustrated in (h) in FIG. 4 and (h) in FIG. 6, cutting intervals differ between the second embodiment and the first embodiment. In the second embodiment, since the center position of adjacent bars 24 is the cutting position 17, the cutting intervals are approximately equal to the distance L1 between the adjacent bars 24. Therefore, by inputting the distance L1 of the adjacent bars 24 to the image processing device 6, the observer obtains a three-dimensional image 7 of which a correct width is set.

It should be noted that, while the center position of adjacent bars 24 is adopted as the cutting position 17 in the second embodiment, the cutting position 17 may be any position other than a position of the lattice point 25 (a position on a line of the bar 24). As long as the cutting position 17 is a position other than the position of the lattice point 25, discontinuous sectional images of the grid mesh 23 appear on the SEM image 5 and the observer can perform (9) Positioning step of the SEM images 5. For example, even when the cutting position 17 is set at a position slightly deviated from the position of the lattice point 25, the observer can perform (9) Positioning step of the SEM images 5. Even in this case, since the cutting intervals are approximately equal to the distance L1 between the adjacent bars 24, the observer can correctly set the width of the three-dimensional image 7 in (11) Setting step of dimensions of the three-dimensional image 7.

According to the second embodiment described above, since the specimen 1 is cut at approximately constant narrow intervals and a sectional image of the grid mesh 23 appearing in the SEM image 5 is used as a guide when positioning a sectional image of the specimen 1 on each SEM image 5, an accurate three-dimensional image 7 can be reconstructed.

It should be noted that, in the first and second embodiments, when the sectional specimen preparation device 3 is provided with a shielding plate position adjustment mechanism capable of rotating around the Z-axis direction in FIG. 2A, after mounting the grid mesh 23 on the smooth surface of the specimen 1 without paying attention to a mounting direction in (3) Mounting step of the grid mesh 23, the observer may determine the cutting position 17 in (5) Determination step of the cutting position 17 by rotating the shielding plate position adjustment mechanism and adjusting the position of the shielding plate 16 so that an angle formed between the side that causes the cutting position 17 to be formed on the specimen 1 among the sides of the shielding plate 16 and the bar 24 of the grid mesh 23 on the specimen 1 is 45 degrees or 90 degrees.

In addition, when the sectional specimen preparation device 3 is provided with the specimen mount position adjustment mechanism 14 capable of rotating around the Z-axis direction in FIG. 2A, after mounting the grid mesh 23 on the smooth surface of the specimen 1 without paying attention to a mounting direction in (3) Mounting step of the grid mesh 23, the observer may determine the cutting position 17 in (5) Determination step of the cutting position 17 by rotating the specimen mount position adjustment mechanism 14 and adjusting the position of the specimen 1 so that an angle formed between the side that causes the cutting position 17 to be formed on the specimen 1 among the sides of the shielding plate 16 and the bar 24 of the grid mesh 23 on the specimen 1 is 45 degrees or 90 degrees.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A three-dimensional image reconstruction method of reconstructing a three-dimensional image of a specimen, the method comprising:
    alternately repeating a cross section preparation step and a sectional image acquisition step,
    the cross section preparation step prepares a cross section of the specimen by using a sectional specimen preparation device which is provided with a shielding member disposed so as to cover a part of the specimen, and which prepares a cross section at a processing position on the specimen with an ion beam, the processing position being a boundary between a portion of the specimen exposed from a linear end edge of the shielding member and a portion of the specimen covered by the shielding member; and
    the sectional image acquisition step acquires a sectional image of the specimen with an imaging means, and
    arranging a plurality of the acquired sectional images with an image processing device in an order in which the acquired sectional images have been captured,
    the cross section preparation step comprises:
    a specimen preparation step of attaching, on a surface of the specimen, a grid-like mark member in which rectangular openings are two-dimensionally arranged, and disposing the grid-like mark member under the shielding member so that a side of each of the rectangular openings of the grid-like mark member forms a 45-degree angle with respect to a direction in which the linear end edge of the shielding member extends; and a processing position determination step of adjusting relative positions of the shielding member and the grid-like mark member by using the grid-like mark member as an index of the processing position.

2. A three-dimensional image reconstruction method of reconstructing a three-dimensional image of a specimen, the method comprising:

alternately repeating a cross section preparation step and a sectional image acquisition step, the cross section preparation step prepares a cross section of the specimen by using a sectional specimen preparation device which is provided with a shielding member disposed so as to cover a part of the specimen, and which prepares a cross section at a processing position on the specimen with an ion beam, the processing position being a boundary between a portion of the specimen exposed from a linear end edge of the shielding member and a portion of the specimen covered by the shielding member; and the sectional image acquisition step acquires a sectional image of the specimen with an imaging means, and arranging a plurality of the acquired sectional images with an image processing device in the order in which the acquired sectional images have been captured, the cross section preparation step comprising:

a specimen preparation step of attaching, on a surface of the specimen, a grid-like mark member in which rectangular openings are two-dimensionally arranged, and disposing the grid-like mark member under the shielding member so that a side of each of the rectangular openings of the grid-like mark member forms a 90-degree angle with respect to a direction in which the linear end edge of the shielding member extends; and a processing position determination step of adjusting relative positions of the shielding member and the grid-like mark member by using the grid-like mark member as an index of the processing position.

3. The three-dimensional image reconstruction method according to claim 1, the processing position determination step adjusts relative positions of the shielding member and the grid-like mark member by using a position of a lattice point of the grid-like mark member as the processing position.

4. The three-dimensional image reconstruction method according to claim 2, the processing position determination step adjusts relative positions of the shielding member and the grid-like mark member by using a position of a lattice point of the grid-like mark member as the processing position.

5. The three-dimensional image reconstruction method according to claim 2, the processing position determination step adjusts relative positions of the shielding member and the grid-like mark member by using a position other than a position of a lattice point of the grid-like mark member as the processing position.

6. The three-dimensional image reconstruction method according to claim 1, further comprising:

before the step of arranging the plurality of sectional images in the order in which the sectional images have been captured, selecting a sectional image to be used as a reference from the plurality of sectional images, and aligning a position of a sectional image of the grid-like mark member on a sectional image other than the reference sectional image with a position of a sectional image of the grid-like mark member on the reference sectional image.

7. The three-dimensional image reconstruction method according to claim 2, further comprising:

before the step of arranging the plurality of sectional images in the order in which the sectional images have been captured, selecting a sectional image to be used as a reference from the plurality of sectional images, and aligning a position of a sectional image of the grid-like mark member on a sectional image other than the reference sectional image with a position of a sectional image of the grid-like mark member on the reference sectional image.

* * * * *